(12) United States Patent
Hosono et al.

(10) Patent No.: US 9,978,979 B2
(45) Date of Patent: May 22, 2018

(54) LIGHT-EMITTING DEVICE, DISPLAY APPARATUS AND LIGHTING APPARATUS

(71) Applicants: JAPAN SCIENCE AND TECHNOLOGY AGENCY, Kawaguchi-shi (JP); TOKYO INSTITUTE OF TECHNOLOGY, Meguro-ku (JP); Asahi Glass Company, Limited, Chiyoda-ku (JP)

(72) Inventors: Hideo Hosono, Meguro-ku (JP); Yoshitake Toda, Meguro-ku (JP); Nobuhiro Nakamura, Chiyoda-ku (JP); Naomichi Miyakawa, Chiyoda-ku (JP); Satoru Watanabe, Chiyoda-ku (JP); Toshinari Watanabe, Chiyoda-ku (JP)

(73) Assignees: JAPAN SCIENCE AND TECHNOLOGY AGENCY, Kawaguchi-shi (JP); TOKYO INSTITUTE OF TECHNOLOGY, Meguro-ku (JP); Asahi Glass Company, Limited, Chiyoda-ku (JP)

(*) Notice: Subject to any disclaimer, the term of this patent is extended or adjusted under 35 U.S.C. 154(b) by 0 days. days.

(21) Appl. No.: 15/460,426

(22) Filed: Mar. 16, 2017

(65) Prior Publication Data
US 2017/0186989 A1  Jun. 29, 2017

Related U.S. Application Data

(63) Continuation of application No. PCT/JP2015/076341, filed on Sep. 16, 2015.

(30) Foreign Application Priority Data

Sep. 18, 2014 (JP) .................................. 2014-190359

(51) Int. Cl.
*H01L 51/50* (2006.01)
*H01L 27/32* (2006.01)
(Continued)

(52) U.S. Cl.
CPC ...... *H01L 51/5092* (2013.01); *H01L 27/3276* (2013.01); *H01L 51/0096* (2013.01);
(Continued)

(58) Field of Classification Search
CPC ............. H01L 51/5092; H01L 27/3276; H01L 51/5203; H01L 51/0096; H01L 51/5056;
(Continued)

(56) References Cited

U.S. PATENT DOCUMENTS

2005/0225234 A1  10/2005  Tyan et al.
2009/0220680 A1  9/2009  Winters
(Continued)

FOREIGN PATENT DOCUMENTS

JP  2004-47179  2/2004
JP  2007-142196  6/2007
(Continued)

OTHER PUBLICATIONS

Written opinion dated Dec. 22, 2015 in PCT/JP2015/076341, filed on Sep. 16, 2015.

*Primary Examiner* — Roy Potter
(74) *Attorney, Agent, or Firm* — Oblon, McClelland, Maier & Neustadt, L.L.P.

(57) ABSTRACT

A light-emitting device includes a pair of first electrodes arranged separated from and opposing each other on a first surface of a substrate; a light-emitting layer arranged on at least one of the first electrodes; a second electrode arranged on the light-emitting layer; and a bridge layer connecting the
(Continued)

first electrodes. The bridge layer is formed of a material having a resistance that falls within a range of 100 kΩ to 100 MΩ.

15 Claims, 11 Drawing Sheets

(51) Int. Cl.
  *H01L 51/52* (2006.01)
  *H01L 51/00* (2006.01)
  *H01L 51/56* (2006.01)
(52) U.S. Cl.
  CPC ...... *H01L 51/5012* (2013.01); *H01L 51/5056* (2013.01); *H01L 51/5072* (2013.01); *H01L 51/5203* (2013.01); *H01L 51/56* (2013.01); *H01L 2251/558* (2013.01)
(58) Field of Classification Search
  CPC . H01L 51/5072; H01L 51/5012; H01L 51/56; H01L 2251/558
  See application file for complete search history.

(56) References Cited

U.S. PATENT DOCUMENTS

| | | |
|---|---|---|
| 2009/0267064 A1 | 10/2009 | Yano et al. |
| 2012/0068620 A1 | 3/2012 | Ishimura |
| 2013/0119324 A1 | 5/2013 | Morita et al. |
| 2014/0291671 A1* | 10/2014 | Yamazaki ......... H01L 21/02554 257/43 |
| 2014/0291673 A1* | 10/2014 | Yamazaki ........... H01L 29/7869 257/43 |

FOREIGN PATENT DOCUMENTS

| | | |
|---|---|---|
| JP | 2008-71930 | 3/2008 |
| JP | 2011-513915 | 4/2011 |
| JP | 2012-49489 | 3/2012 |
| WO | WO 2011/158368 A1 | 12/2011 |

* cited by examiner

LIGHT-EMITTING DEVICE, DISPLAY APPARATUS AND LIGHTING APPARATUS

CROSS-REFERENCE TO RELATED APPLICATION

The present application is a continuation application filed under 35 U.S.C. 111(a) claiming benefit under 35 U.S.C. 120 and 365(c) of PCT International Application No. PCT/JP2015/076341 filed on Sep. 16, 2015 and designating the U.S., which claims priority of Japanese Patent Application No. 2014-190359 filed on Sep. 18, 2014. The entire contents of the foregoing applications are incorporated herein by reference.

BACKGROUND OF THE INVENTION

1. Field of the Invention

The present invention relates to a light-emitting device, a display apparatus and a lighting apparatus.

2. Description of the Related Art

Light-emitting devices such as organic EL (Electroluminescent) elements are widely used for display (display apparatuses), backlights, lighting apparatuses and the like.

A light-emitting device generally includes a first electrode and a second electrode provided on a substrate, and a light-emitting layer provided between the first and second electrodes. When an electric voltage is applied between the electrodes, holes and electrons are injected into the light-emitting layer from the electrodes, respectively. When the holes and the electrons are recombined in the light-emitting layer, binding energy is generated. By the binding energy, a light-emitting material in the light-emitting layer is excited. When the excited light-emitting material returns to a ground state, light-emission occurs. By using the light-emission, light can be emitted to the outside.

Japanese Unexamined Patent Application Publication No. 2004-047179 discloses forming an antistatic film on a back surface of the substrate in order to prevent static charge of the device.

SUMMARY OF THE INVENTION

It is a general object of at least one embodiment of the present invention to provide light-emitting device, a display apparatus and a lighting apparatus that substantially obviate one or more problems caused by the limitations and disadvantages of the related art.

The present invention provides a light-emitting device including a pair of first electrodes arranged separated from and opposing each other on a first surface of a substrate; a light-emitting layer arranged on at least one of the first electrodes; a second electrode arranged on the light-emitting layer; and a bridge layer connecting the first electrodes. The bridge layer is formed of a material having a resistance that falls within a range of 100 kΩ to 100 MΩ.

Moreover, the present invention also provides a display apparatus and a lighting apparatus including the light-emitting device.

BRIEF DESCRIPTION OF THE DRAWINGS

Other objects and further features of embodiments will become apparent from the following detailed description when read in conjunction with the accompanying drawings, in which.

DESCRIPTION OF THE PREFERRED EMBODIMENTS

In the following, with reference to the drawings, an embodiment of the present invention will be described.

(Light-Emitting Device According to the Embodiment)

Figure 1:
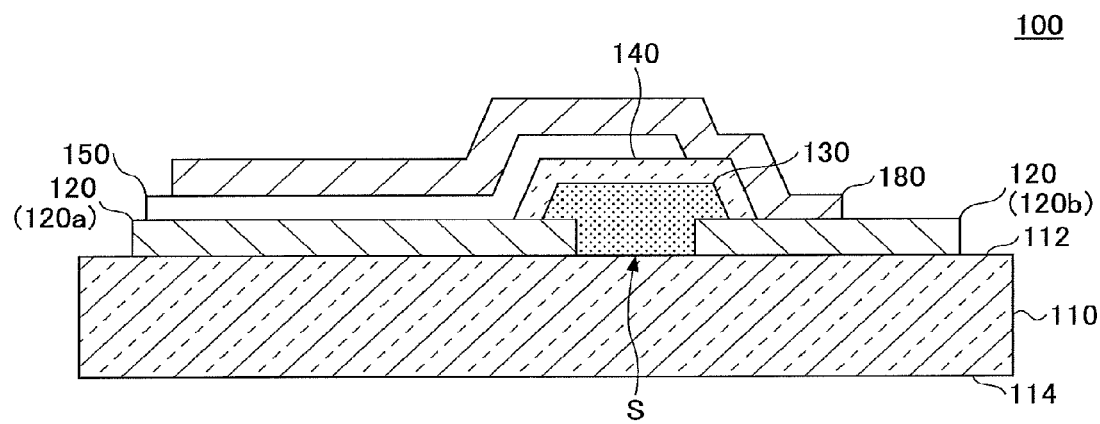
FIG. 1 is a cross-sectional diagram schematically illustrating a light-emitting device according to an embodiment of the present invention.

FIG. 1 schematically illustrates a cross-section of a light-emitting device 100 (in the following, referred to as a "first light-emitting device") according to the embodiment of the present invention.

As illustrated in FIG. 1, the first light-emitting device includes a substrate 110, a first electrode 120, an organic layer 150 and a second electrode 180.

The first electrode 120 includes a pair of opposing electrode layers that are not in direct contact with each other on a first surface 112 of the substrate 110 (a first bottom face electrode layer 120a and a second bottom face electrode layer 120b). A resin layer 130 is arranged so as to fill a space S between the first bottom face electrode layer 120a and the second bottom face electrode layer 120b of the first electrode 120, that are arranged opposingly.

The organic layer 150 includes an electron injection layer, an electron transport layer, an organic light-emitting layer, a hole transport layer, a hole injection layer and the like. However, when the respective layers other than the organic light-emitting layer are unnecessary, the layer may be omitted.

The second electrode 180 is arranged so as to cover the organic layer 150, and is electrically connected to one of the bottom face electrode layers included in the first electrode 120 (e.g. the second bottom face electrode layer 120b).

In the example illustrated in FIG. 1, the lower surface 114 (second surface) of the substrate 110 is a light extraction surface. Therefore, the substrate 110 is a transparent substrate, and the first electrode 120 is a transparent electrode.

The first light-emitting device 100 provided with the above-described configuration can be used, for example, in a lighting apparatus or the like.

When operating the first light-emitting device 100, first, an electric voltage is applied between the first bottom face electrode layer 120a and the second bottom face electrode layer 120b, so that the first bottom face electrode layer 120a is a cathode and the second bottom face electrode layer 120b is an anode. Then, electrons are emitted from the first bottom face electrode layer 120a side toward the organic layer 150, and holes are emitted from the second electrode 180 side connected to the second bottom face electrode layer 120b toward the organic layer 150. The electrons and holes are recombined in an organic light-emitting layer arranged inside the organic layer 150. By binding energy generated at this time, a light-emitting material in the organic light-emitting layer is excited. When the excited light-emitting material returns to a ground state, light-emission occurs. This light-emission is output from the second surface 114 of the substrate 110. According to the above-described operation, the lighting apparatus or the like including the first light-emitting device 100 can be made brighter (switched to "ON").

Here, as illustrated in FIG. 1, the first light-emitting device 100 further includes a bridge layer 140 that is arranged on the resin layer 130 so as to cover the resin layer 130. The bridge layer 140 is electrically connected to the two bottom face electrode layers 120a, 120b of the first electrode 120, respectively, and arranged so as to step over the space S between the opposing electrode layers 120a and 120b.

The bridge layer 140 is formed of a material selected from a group including a zinc-tin-silicon-oxygen base, a zinc-tin-oxygen base, and a zinc-silicon-oxygen base, and has a resistance in a range of 100 kΩ to 100 MΩ.

As described above, in conventional light-emitting device, there is a problem of damage by electrostatic discharge.

However, in the first light-emitting device 100 according to the embodiment, the bridge layer 140 is arranged so as to connect the first bottom face electrode layer 120a with the second bottom face electrode layer 120b. According to the above-described configuration, the bridge layer 140 functions as a proper resistor device between the first bottom face electrode layer 120a and the second bottom face electrode layer 120b. Therefore, when static electricity is discharged, for example, a relatively small electric current (bypass current) flows from the second bottom face electrode layer 120b to the first bottom electrode layer 120a through the bridge layer 140.

Moreover, the bridge layer 140 is formed of the above-described oxide, and is unlikely to be damaged by a surge voltage.

Therefore, the light-emitting device 100 can be prevented from being significantly damaged by electrostatic discharge due to an instantaneous great current between the bottom face electrode layers 120a and 120b when static electricity is discharged.

Furthermore, the bridge layer 140 is formed of an amorphous oxide. Because such amorphous layer includes neither grains nor domains, the amorphous layer has a feature that a smooth exposure surface can be formed when patterning processing is performed.

Therefore, when the organic layer 150 is formed on an upper part (and a side part) of the bridge layer 140, an adhesion property of a layer on an interface between the bridge layer 140 and the organic layer 150 is improved, and a coverage characteristic of the organic layer 150 can be enhanced.

The bridge layer 140 offers great mobility for carriers such as electrons or holes. Therefore, the bridge layer 140 can complement a part of the function of the organic layer 150. Specifically, the bridge layer 140 can be used as an electron injection layer, an electron transport layer, a hole injection layer and/or a hole transport layer. In such an aspect, in a configuration illustrated in FIG. 1, the bridge layer 140 may be, for example, arranged so as to cover almost all the upper part of the first bottom face electrode layer 120a.

(Another Light-Emitting Device According to Embodiment)

Figure 2:
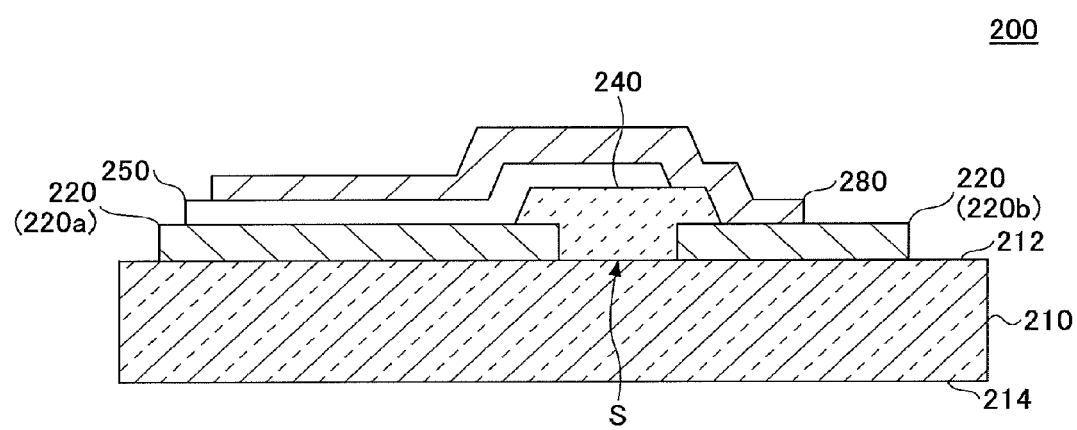
FIG. 2 is a cross-sectional diagram schematically illustrating another light-emitting device according to the embodiment.

Next, with reference to FIG. 2, another light-emitting device according to the embodiment of the present invention will be described. FIG. 2 schematically illustrates a cross-section of another light-emitting device 200 according to the embodiment of the present invention (in the following, referred to as a "second light-emitting device").

As illustrated in FIG. 2, the second light-emitting device 200 basically has almost the same configuration as the first light-emitting device 100 illustrated in FIG. 1. Therefore, in the second light-emitting device 200 illustrated in FIG. 2, for the same member as in FIG. 1, a reference numeral obtained by adding 100 to the reference numeral used in FIG. 1 is used. For example, the second light-emitting device 200 includes a substrate 210, a first electrode 220 (a first bottom face electrode layer 220a and a second bottom face electrode layer 220b), a bridge layer 240, an organic layer 250, and a second electrode 280.

However, the second light-emitting device 200 is different from the first light-emitting device 100 in that a resin layer is absent in a space S between the first bottom face electrode layer 220a and the second bottom face electrode layer 220b. That is, in the second light-emitting device 200, the space S is filled by the bridge layer 240.

As described above, the bridge layer 240 is formed of a material selected from a group including a zinc-tin-silicon-oxygen base, a zinc-tin-oxygen base, and a zinc-silicon-oxygen base, and has a resistance in the range of 100 kΩ to 100 MΩ.

Therefore, according to the presence of the bridge layer 240, the second light-emitting device 200 also can be prevented from being significantly damaged by electrostatic discharge due to an instantaneous great current between the bottom face electrode layers 220a and 220b when static electricity is discharged.

Moreover, because the bridge layer 240 formed of an oxide includes neither grains nor domains, a smooth exposure surface can be formed when patterning processing is performed. Therefore, in the second light-emitting device 200, an adhesion property of a layer on an interface between the bridge layer 240 and the organic layer 250 is improved, and a coverage characteristic of the organic layer 250 can be enhanced.

Furthermore, in the second light-emitting device 200, arrangement of the resin layer 130 used for filling the space S in the first light-emitting device 100 can be omitted, and the manufacturing process can be simplified.

(Yet Another Light-Emitting Device According to Embodiment)

Figure 3:
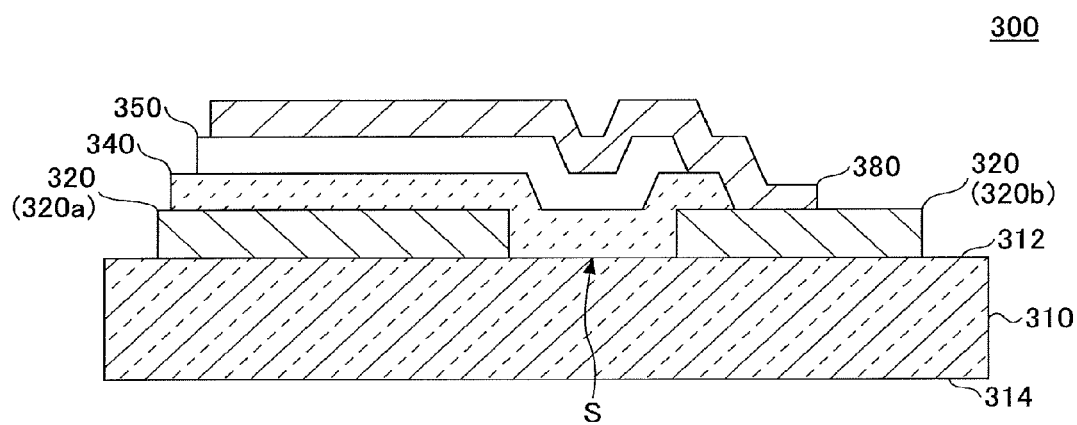
FIG. 3 is a cross-sectional diagram schematically illustrating yet another light-emitting device according to the embodiment.

Next, with reference to FIG. 3, yet another light-emitting device according to the embodiment of the present invention will be described. FIG. 3 schematically illustrates yet another light-emitting device 300 according to the embodiment of the present invention (in the following, referred to as a "third light-emitting device").

As illustrated in FIG. 3, the third light-emitting device 300 basically has almost the same configuration as the second light-emitting device 200 illustrated in FIG. 3. Therefore, in the third light-emitting device 300 illustrated in FIG. 3, for the same member as in FIG. 2, a reference numeral obtained by adding 100 to the reference numeral used in FIG. 2 is used. For example, the third light-emitting device 300 includes a substrate 310, a first electrode 320 (a first bottom face electrode layer 320a and a second bottom face electrode layer 320b), a bridge layer 340, an organic layer 350, and a second electrode 380.

However, in the third light-emitting device 300, an arrangement form of the bridge layer 340 is different from that in the second light-emitting device 200.

As described above, the bridge layer 340 has a great mobility for carriers such as electrons or holes. Therefore, the bridge layer 340 can complement a part of the function of the organic layer 350. For example, in the third light-emitting device 300 illustrated in FIG. 3, the bridge layer 340 has a function as an electron injection layer, and arranged on the upper part of the first bottom face electrode layer 320a so as to cover almost all the first bottom face electrode layer 320a. According to the above-described configuration, the number of layers included in the organic layer 350 can be reduced.

It is obvious for a person skilled in the art that the third light-emitting device 300 having the above-described configuration also has the same effect of preventing damage by electrostatic discharge as the first and second light-emitting devices 100, 200.

(Still Another Light-Emitting Device According to Embodiment)

As described above, assuming the case where the light-emitting device according to the present invention is applied to a lighting apparatus, a configuration of the light-emitting device and an effect thereof have been described. However, the example of application of the light-emitting device according to the present invention is not limited to this. Then, in the following, as another example, in the case where the light-emitting device according to the present invention is a light-emitting device for a display apparatus, a configuration and an effect will be described.

Figure 4:
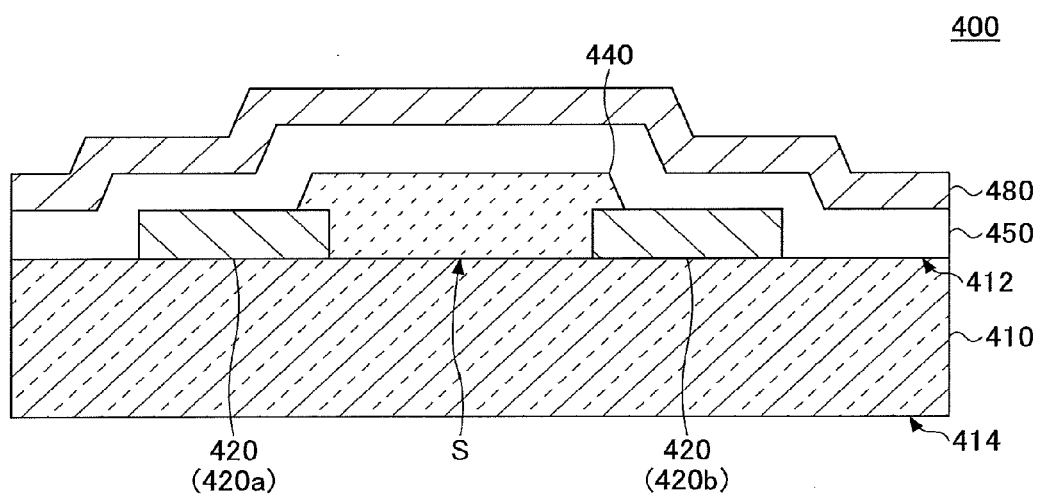
FIG. 4 is a cross-sectional diagram schematically illustrating still another light-emitting device according to the embodiment.

FIG. 4 schematically illustrates a cross section of a part of the light-emitting device (in the following, referred to as a "fourth light-emitting device") according to the embodiment of the present invention that can be used for a display apparatus or the like.

As illustrated in FIG. 4, the fourth light-emitting device 400 includes a substrate 410, a first column electrode 420, a bridge layer 440, an organic layer 450, and a second row electrode 480.

The first column electrode 420 includes a pair of opposing electrode layers (a first bottom face electrode layer 420a and a second bottom face electrode layer 420b) on a first surface 412 of the substrate 410. The first column electrode 420 may include a set of three or more bottom face electrode layers arranged via a space S between one another.

The space S is filled in and arranged by the bridge layer 440. The bridge layer 440 is electrically connected to two adjacent bottom face electrode layers 420a, 420b, respectively, and arranged so as to step over the bottom face electrode layers 420a, 420b.

As a different configuration from that illustrated in FIG. 4, the space S may be filled with a resin layer, and the bridge layer 440 may be arranged so as to cover the resin layer.

The bridge layer 440 is formed of a material selected from a group including a zinc-tin-silicon-oxygen base, a zinc-tin-oxygen base, and a zinc-silicon-oxygen base, and has a resistance in the range of 100 kΩ to 100 MΩ.

The organic layer 450 is arranged on the first column electrode 420 and the bridge layer 440. The organic layer 450 includes an electron injection layer, an electron transport layer, an organic light-emitting layer, a hole transport layer, a hole injection layer and the like. However, when the respective layers other than the organic light-emitting layer are unnecessary, the layer may be omitted.

The second row electrode 480 is arranged so as to cover the organic layer 450. Although it is not apparent from the drawing, usually the second row electrode 480 includes a plurality of upper electrode layers that are arranged adjacent to each other via a space.

In the example illustrated in FIG. 4, the lower surface 414 (second surface) of the substrate 410 is a light extraction surface. Therefore, the electrode 410 is a transparent substrate, and the first column electrode 420 is a transparent electrode.

The fourth light-emitting device 400 having the above-described structure can be used in a passive-controlled display apparatus or the like.

Because an operation method for the passive-controlled display apparatus is obvious for a person skilled in the art, the method will not be described further.

Here, the fourth light-emitting device 400 includes the bridge layer 440 having the above-described feature. Therefore, the fourth light-emitting device 400 also can be prevented from being significantly damaged by electrostatic discharge when static electricity is discharged.

Moreover, because the bridge layer 440 formed of an amorphous oxide includes neither grains nor domains, a smooth exposure surface can be formed when a patterning procedure is performed. Therefore, in the fourth light-emitting device 400, an adhesion property of a layer on an interface between the bridge layer 440 and the organic layer 450 is improved, and a coverage characteristic of the organic layer 450 can be enhanced.

(Yet Another Light-Emitting Device According to Embodiment)

Figure 5:
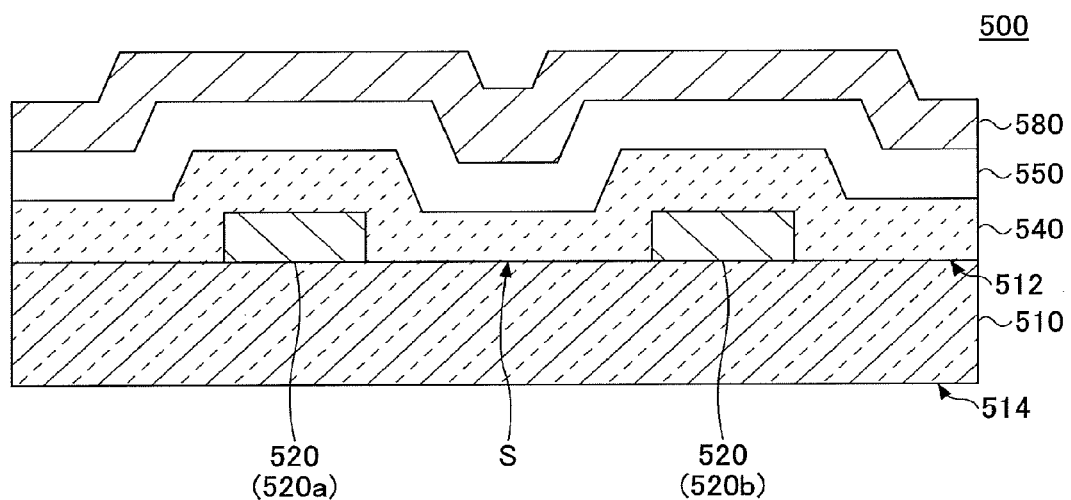
FIG. 5 is a cross-sectional diagram schematically illustrating yet another light-emitting device according to the embodiment.

Next, with reference to FIG. 5, yet another light-emitting device according to the embodiment of the present invention will be described. FIG. 5 schematically illustrates a cross section of yet another light-emitting device 500 according to the embodiment of the present invention (in the following, referred to as a "fifth light-emitting device").

As illustrated in FIG. 5, the fifth light-emitting device 500 basically has almost the same configuration as the fourth light-emitting device 400 illustrated in FIG. 4. Therefore, in the fifth light-emitting device 500 illustrated in FIG. 5, for the same member as in FIG. 4, a reference numeral obtained by adding 100 to the reference numeral used in FIG. 4 is used. For example, the fifth light-emitting device 500 includes a substrate 510, a first column electrode 520 (a first bottom face electrode layer 520*a* and a second bottom face electrode layer 520*b*), a bridge layer 540, an organic layer 550, and a second row electrode 580.

However, in the fifth light-emitting device 500, an arrangement foil of the bridge layer 540 is different from that in the fourth light-emitting device 400.

As described above, the bridge layer 540 has a great mobility for carriers such as electrons or holes. Therefore, the bridge layer 540 can complement a part of the function of the organic layer 550. Therefore, in the example of the fifth light-emitting device 500 illustrated in FIG. 5, the bridge layer 540 has a function as an electron injection layer, and arranged on the upper part of the respective bottom face electrode layers 520*a*, 520*b* that are included in the first column electrode 520 so as to cover these layers. According to the above-described configuration, the number of layers included in the organic layer 550 can be reduced.

It is obvious for a person skilled in the art that the fifth light-emitting device 500 having the above-described configuration also has the same effect of preventing damage by electrostatic discharge as the fourth light-emitting device 400.

(Still Another Light-Emitting Device According to Embodiment)

Figure 6:
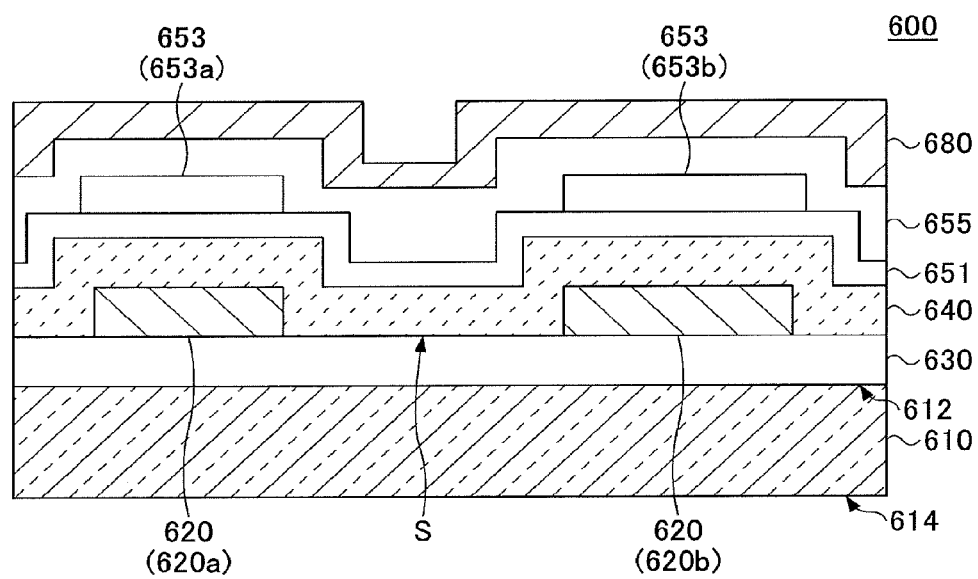
FIG. 6 is a cross-sectional diagram schematically illustrating still another light-emitting device according to the embodiment.

Next, with reference to FIG. 6, still another light-emitting device according to the embodiment of the present invention will be described. FIG. 6 schematically illustrates a cross section of still another light-emitting device 600 according to the embodiment of the present invention (in the following, referred to as a "sixth light-emitting device").

As illustrated in FIG. 6, the sixth light-emitting device 600 includes a substrate 610, a TFT backplane 630, a first electrode 620, a bridge layer 640, respective layers 651 to 655 forming an organic layer, and a second electrode 680.

The TFT backplane 630 is arranged on a first surface 612 of the substrate 610. The TFT backplane 630 includes various semiconductor circuit devices.

The first electrode 620 includes a pair of opposing electrode layers (a first bottom face electrode layer 620*a* and a second bottom face electrode 620*b*) on the TFT backplane 630. The first electrode 620 mainly includes a set of two or more bottom face electrode layers 620*a* and 620*b* arranged via a space S inbetween.

The bridge layer 640 is arranged on the first electrode 620.

As described above, the bridge layer 640 has great mobility for carriers such as electrons or holes. Therefore, the bridge layer 640 can complement a part of the function of the organic layer. Therefore, in the example of the sixth light-emitting device 600 illustrated in FIG. 6, the bridge layer 640 has a function as an electron injection layer, and arranged on the upper part of the respective bottom face electrode layers 620*a*, 620*b* that are included in the first electrode 620 so as to cover these layers.

In the example illustrated in FIG. 6, the bridge layer 640 fills the space S. As a different configuration from this, the space S may be filled with a resin layer, and the bridge layer 640 may be arranged so as to cover the resin layer.

The bridge layer 640 is formed of a material selected from a group including a zinc-tin-silicon-oxygen base, a zinc-tin-oxygen base, and a zinc-silicon-oxygen base, and has a resistance in the range of 100 kΩ to 100 MΩ.

On the bridge layer 640, the respective layers 651 to 655 that are included in the organic layer are arranged. More specifically, on the bridge layer 640, an electron transport layer 651, an organic light-emitting layer 653, and a hole transport layer 655 (or a hole injection layer) are laminated in this order. The organic light-emitting layer 653 is arranged, not as consecutive layers, but as separated layers in regions corresponding to the respective bottom face electrode layers 620*a* and 620*b*. In the example, illustrated in FIG. 6, the first organic light-emitting layer 653*a* is arranged in a region corresponding to the bottom face electrode layer 620*a*, and the second organic light-emitting layer 653*b* is arranged in a region corresponding to the bottom face electrode layer 620*b*. Emission colors of the first organic light-emitting layer 653*a* and the second organic light-emitting layer 653*b* may be different from each other.

The second electrode 680 is arranged so as to cover the hole transport layer 655 (or the hole injection layer).

In the example illustrated in FIG. 6, the lower surface 614 (second surface) of the substrate 610 is a light extraction surface. Therefore, the electrode 610 is a transparent substrate, and the first electrode 620 is a transparent electrode.

The sixth light-emitting device 600 having the above-described structure can be used in an active-controlled display apparatus or the like.

Because an operation method for the display apparatus is obvious for a person skilled in the art, the method will not be described further.

Here, the sixth light-emitting device 600 includes the bridge layer 640 having the above-described feature. Therefore, the sixth light-emitting device 600 also can be prevented from being significantly damaged by electrostatic discharge when static electricity is discharged.

Moreover, because the bridge layer 640 formed of an amorphous oxide includes neither grains not domains, a smooth exposure surface can be formed when a patterning procedure is performed. Therefore, in the sixth light-emitting device 600, an adhesion property of a layer on an interface between the bridge layer 640 and the electron transport layer 651 is improved, and a coverage characteristic of the organic layer 650 can be enhanced.

(Members of Light-Emitting Device According to Embodiment)

Next, the respective members of the light-emitting device according to the embodiment will be described in detail. Here, as an example, specifications of the respective members included in the first light-emitting device 100, illustrated in FIG. 1, will be described. However, it is apparent for a person skilled in the art that the following descriptions can be applied to a light-emitting device of the other configuration, such as the second to sixth light-emitting devices 200 to 600, in the same way or with a small modification.

Upon indicating the respective members, the reference numeral illustrated in FIG. 1 will be used.

(Substrate 110)

A material of which the substrate is formed is not particularly limited. The substrate 110 may be a glass substrate, a plastic substrate or the like. When the light-emitting device is of a bottom-emission type and the second surface 114 of the substrate 110 is the light extraction surface, the substrate is a transparent substrate.

(First Electrode 120)

When the light-emitting device is of the bottom-emission type, the first electrode 120 is a transparent electrode. In such a case, the first electrode 120 may be formed of ITO, tin oxide, or the like.

Alternatively, when the light-emitting device is of a top-emission type, the first electrode 120 may be a metallic electrode formed of aluminum alloy or the like.

(Resin Layer 130)

The resin layer 130 may be formed of any resin material as long as the resin layer 130 can fill the space S appropriately. The resin layer 130 may be formed of a polyimide resin or an acrylic resin, for example.

(Bridge Layer 140)

The bridge layer 140 is formed of a material that is an oxide and selected from a group including a zinc-tin-silicon-oxygen base, a zinc-tin-oxygen base, and a zinc-silicon-oxygen base. The bridge layer may be formed of a zinc-tin-germanium-oxygen base.

The bridge layer 140 may be amorphous, microcrystalline, or in a form where amorphous material and microcrystal are mixed.

When the bridge layer 140 is formed of a zinc-silicon-oxygen based material, the bridge layer 140 includes zinc (Zn), silicon (Si), and oxygen (O), and preferably has a ratio of numbers of atoms Zn/(Zn+Si) of 0.30 to 0.95. When the ratio of numbers of atoms Zn/(Zn+Si) is 0.30 or more but 0.95 or less, the above-described resistance can be easily obtained, and a layer with high flatness can be easily obtained. In addition, the bridge layer 140 may be formed of an indium-silicon-oxygen based material, an indium-gallium-zinc-oxygen based material, an indium-zinc-oxygen based material, or a germanium-zinc-oxygen based material. The ratio of numbers of atoms Zn/(Zn+Si) is more preferably 0.6 or more, and further preferably 0.7 or more. The ratio of numbers of atoms Zn/(Zn+Si) is more preferably 0.92 or less, and further preferably 0.90 or less.

When the bridge layer 140 is formed of a zinc-tin-silicon-oxygen based material, the bridge layer 140 includes zinc (Zn), tin (Sn), silicon (Si) and oxygen (O), and in the bridge layer 140 in terms of oxide based on 100 mol % of total of oxides of the bridge layer 140, $SnO_2$ is preferably greater than 15 mol % but less than or equal to 95 mol %. When $SnO_2$ is greater than 15 mol % but less than or equal to 95 mol %, the bridge layer with high flatness can be easily obtained, and the above-described resistance can be easily obtained. $SnO_2$ is more preferably 60 mol % or more, and further preferably greater than 70 mol % or more. $SnO_2$ is preferably less than or equal to 90 mol %, and further preferably less than or equal to 80 mol %. Moreover, in this case, in the bridge layer 140 in terms of oxide based on 100 mol % of total of oxides of the bridge layer 140, $SiO_2$ is preferably 7 mol % or more but 30 mol % or less. When $SiO_2$ is 7 mol % or more but 30 mol % or less, an electron affinity is not too high, and a volume resistivity is not too great, and thereby the above-described resistance can be easily obtained. $SiO_2$ is more preferably 10 mol % or more, and further preferably 20 mol % or more. $SiO_2$ is more preferably 40 mol % or less, and further preferably 30 mol % or less.

When the bridge layer 140 is formed of a zinc-tin-oxygen based material, the bridge layer 140 includes zinc (Zn), tin (Sn), and oxygen (O), and in the bridge layer 140 in terms of oxide based on 100 mol % of total of oxides of the bridge layer 140, $SnO_2$ is preferably greater than 15 mol ° but less than or equal to 95 mol %. When $SnO_2$ is greater than 15 mol % but less than or equal to 95 mol %, the bridge layer with high flatness can be easily obtained, an amorphous thin film state, a microcrystalline thin film state or a thin film state where amorphous material and microcrystal are mixed can be easily retained, the above-described resistance can be easily obtained, and an oxide target for deposition to form a thin film can be easily obtained. $SnO_2$ is more preferably 30 mol % or more, and further preferably 40 mol % or more. $SnO_2$ is more preferably 65 mol % or less, and further preferably 55 mol % or less.

The bridge layer 140 has a resistance in a range of 100 kΩ to 100 MΩ. The resistance of the bridge layer 140 is more preferably greater than or equal to 200 kΩ, further preferably greater than or equal to 500 kΩ, and especially preferably greater than or equal to 1 MΩ. The resistance of the bridge layer 140 is more preferably less than or equal to 50 MΩ, further preferably less than or equal to 20 MΩ, and especially preferably less than or equal to 10 MΩ.

In the bridge layer 140, specific resistance of the deposited film may be 500 Ωcm to 500 kΩcm. For example, in order to obtain a film having specific resistance of about 500 Ωcm, a film having an electron density of $10^{16}$ $cm^{-1}$ and a mobility of 0.13 $cm^2$/Vs may be used. Moreover, in order to obtain a film having the specific resistance of about 500 kΩcm, a film having an electron density of $10^{17}$ $cm^{-1}$ and a mobility of $1.25 \times 10^{-4}$ $cm^2$/Vs may be used. The specific resistance of the film in the bridge layer 140 is more preferably 800 kΩcm or more, and further preferably 1 MΩcm or more. The specific resistance of the film in the bridge layer 140 is more preferably 300 kΩcm or less, and further preferably 100 kΩcm or less.

By changing a material composition, physical parameters of the bridge layer 140 such as electric resistance and mobility can be adjusted to some extent.

Therefore, the bridge layer 140 can be used, as necessary, instead of the electron injection layer, the electron transport layer, the organic light-emitting layer, the hole transport layer, and the hole injection layer in the organic layer 150.

The above-described bridge layer 140 including an amorphous oxide may be formed using a deposition technique such as a sputtering method, a PVD method and the like.

When the bridge layer 140 is amorphous or an amorphous state is dominant in the bridge layer 140, the flatness of the layer can be more easily obtained. Moreover, when the bridge layer 140 is amorphous or an amorphous state is dominant in the bridge layer 140, a relation between the electron affinity and the composition easily becomes linear, and thereby electric power provided to the layer can be easily controlled. Furthermore, when the bridge layer 140 is amorphous or an amorphous state is dominant in the bridge layer 140, a uniform layer can be easily obtained. Because a microcrystalline bridge layer is likely to be oriented in a layer thickness direction compared with an amorphous bridge layer, when microcrystalline state is dominant in the bridge layer 140, electronic characteristic in the layer thickness direction can be easily improved.

The resin layer 130 may be omitted. In this case, the space S is filled with the bridge layer 240 (See, for example, FIG. 2). Then, the manufacturing process can be simplified. In this case, the thickness of the bridge layer 240 is made greater than the thickness of the first electrode 220, and the step difference of the first electrode 220 can be sufficiently covered, and thereby a short-circuit between the first electrode 220 and the second electrode 280 in a step difference part of the first electrode can be prevented. Specifically, the thickness of the bridge layer may be greater than the thickness of the first electrode, the thickness of the bridge layer may be greater than 1.5 times the thickness of the first electrode, and the thickness of the bridge layer may be greater than twice the thickness of the first electrode. The thickness of the bridge layer is preferably 100 nm or more, further preferably 200 nm or more, and especially preferably 300 nm or more.

(Organic Layer)

The organic layer 150 includes an electron injection layer, an electron transport layer, an organic light-emitting layer, a hole transport layer, a hole injection layer and the like. For these layers, conventionally known configurations can be used.

One layer or two or more layers other than the organic light-emitting layer may be omitted. Especially, for example, as described above, when the bridge layer 140 is used as an electron injection layer or a hole injection layer, the electron injection layer and the hole injection layer can be omitted.

(Second Electrode 180)

When the light-emitting device is of the bottom-emission type, the second electrode 180 may be a metallic electrode formed of aluminum alloy or the like. Alternatively, when the light-emitting device is of the top-emission type, the second electrode 180 is a transparent electrode, and may be formed of ITO, tin oxide, or the like.

(Manufacturing Method for Light-Emitting Device According to Embodiment)

Next, with reference to FIG. 7, an example of the manufacturing method for the light-emitting device according to the embodiment of the present invention will be described. Here, as an example, the manufacturing method for the second light-emitting device 200 illustrated in FIG. 2 will be explained. However, it is apparent for a person skilled in the art that the following descriptions can be applied to a light-emitting device of the other configuration, such as the first, and third to sixth light-emitting devices 100, and 300 to 600, in the same way or with a small modification.

Figure 7:
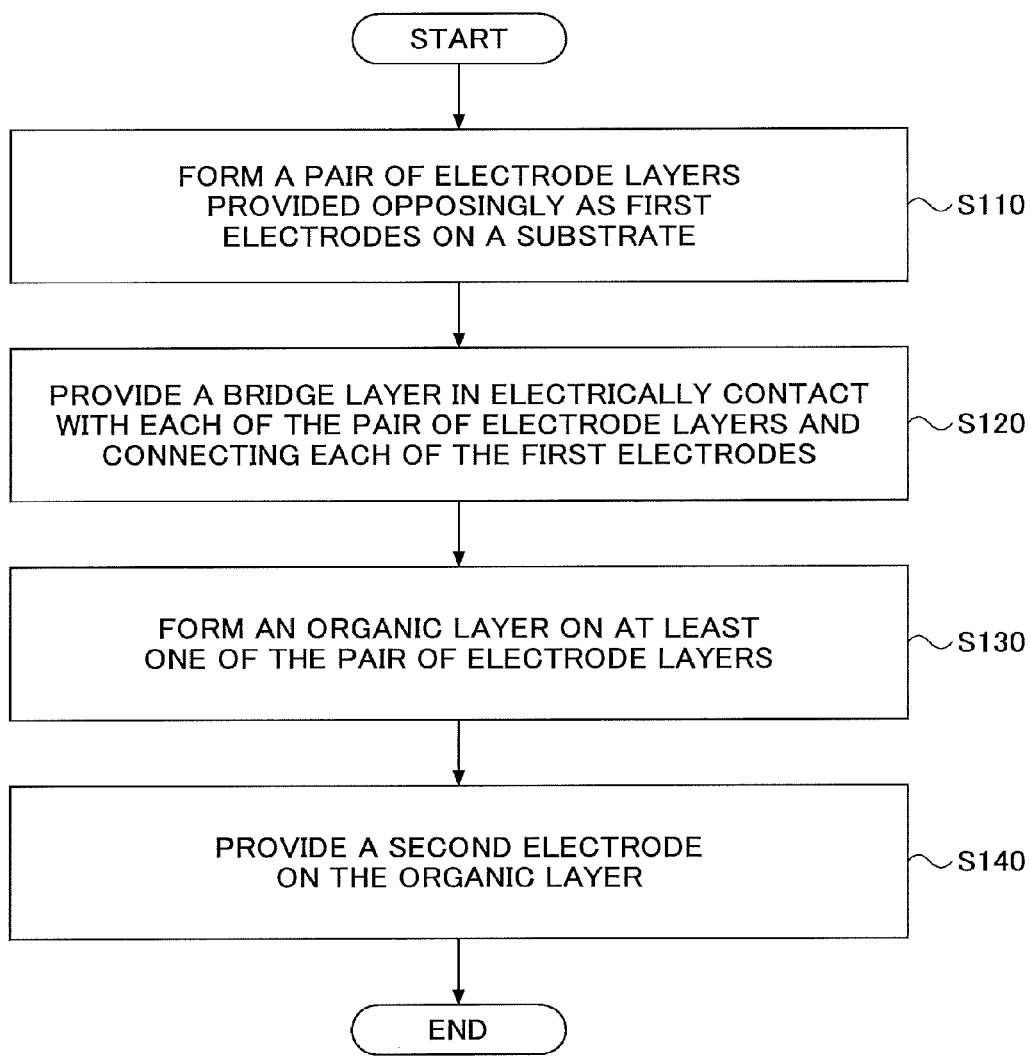
FIG. 7 is a flowchart schematically depicting an example of a manufacturing method for the light-emitting device according to the embodiment.

FIG. 7 schematically illustrates a flow of the manufacturing method for the light-emitting device according to the embodiment of the present invention (hereinafter, referred to as a "first manufacturing method").

As illustrated in FIG. 7, the first manufacturing method includes:

a step of forming a pair of electrode layers arranged opposing to each other as a first electrode on a substrate (step S110);

a step of arranging a bridge layer being in electrically contact with each of the pair of electrode layers and connecting each of the first electrode (step S120);

a step of forming an organic layer on an upper part of at least one of the pair of electrode layers (step S130); and a step of arranging a second electrode on an upper part of the organic layer (step S140).

The respective steps will be described as follows. In the following descriptions, upon indicating each member, the reference numeral illustrated in FIG. 2 will be used.

(Step S110)

First, the substrate 210 is prepared. When the light-emitting device to be manufactured is of the bottom-emission type, the substrate 210 is a transparent substrate.

Next, the first electrode 220 is formed on the substrate 210. When the light-emitting device to be manufactured is of the bottom-emission type, the first electrode 220 is a transparent electrode. The first electrode 220 is subjected to the pattern processing, and formed so as to have at least a pair of electrode layers 220a, 220b.

(Step S120)

Next, the bridge layer 240 is formed that is in contact with the electrode layers 220a, 220b and connects both electrode layers.

The bridge layer 240 may be provided by forming as a whole surface film using a deposition technique such as a sputtering method, and afterwards patterning the film using an etching process or the like.

Here, the bridge layer 240 includes an oxide, and does not have grains and domains. Therefore, after the patterning processing of the bridge layer 240, a smooth exposure surface can be formed. According to the smooth exposure surface, in the processes after step S130, deposition of the respective layers can be properly performed. An amorphous oxide has an advantage in obtaining a smooth exposure surface.

Moreover, as described above, in the conventional light-emitting device, damage by electrostatic discharge during the manufacturing process is also a problem. However, in the first manufacturing method, when the bridge layer 240 is once formed, in the subsequent processes, the bridge layer 240 functions as a proper resistor device between the pair of electrode layers 220a, 220b. Therefore, in the first manufacturing method, even during the manufacturing process for the light-emitting device, significant damage by electrostatic discharge can be avoided.

(Step S130)

Next, the organic layer 250 is formed on an upper part of at least one of the pair of electrode layers 220a, 220b. The organic layer 250 may be in contact with at least a part of the bridge layer 240.

As described above, the exposure surface of the bridge layer 240 is a relatively smooth surface. Therefore, on an interface between the bridge layer 240 and the organic layer 250, an adhesion property of the organic layer 250 is improved, and a coverage characteristic of the organic layer 250 can be enhanced.

The organic layer 250 includes a plurality of layers including the organic light-emitting layer. However, as described above, it is possible to arrange the bridge layer 240 so as to cover the electrode layer 220a, to function as an electron injection layer (See FIG. 3). In this case, one or more layers included in the organic layer 250, e.g. the electron injection layer, can be omitted.

(Step S140)

Next, the second electrode 280 is arranged on an upper part of the organic layer 250. The second electrode 280 may be formed of a metal. When the light-emitting device 200 is applied to a lighting apparatus, the second electrode 280 is electrically connected to at least one of the pair of electrode layers 220a, 220b (e.g. the electrode layer 220b). According to the above-described configuration, it becomes possible to apply electric voltages of opposite polarities to the pair of electrode layers 220a, 220b, respectively.

According to the above-described processes, the second light-emitting device 200, as illustrated in FIG. 2, can be manufactured.

EXAMPLES

In the following, examples 1 to 3 of the present invention will be described.

First Example

The light-emitting device according to the embodiment of the present invention was verified whether to be actually used as a light-emitting device for a lighting apparatus, for the configuration of the above-described second light-emitting device 200 illustrated in FIG. 2 as an example.

Figure 8:
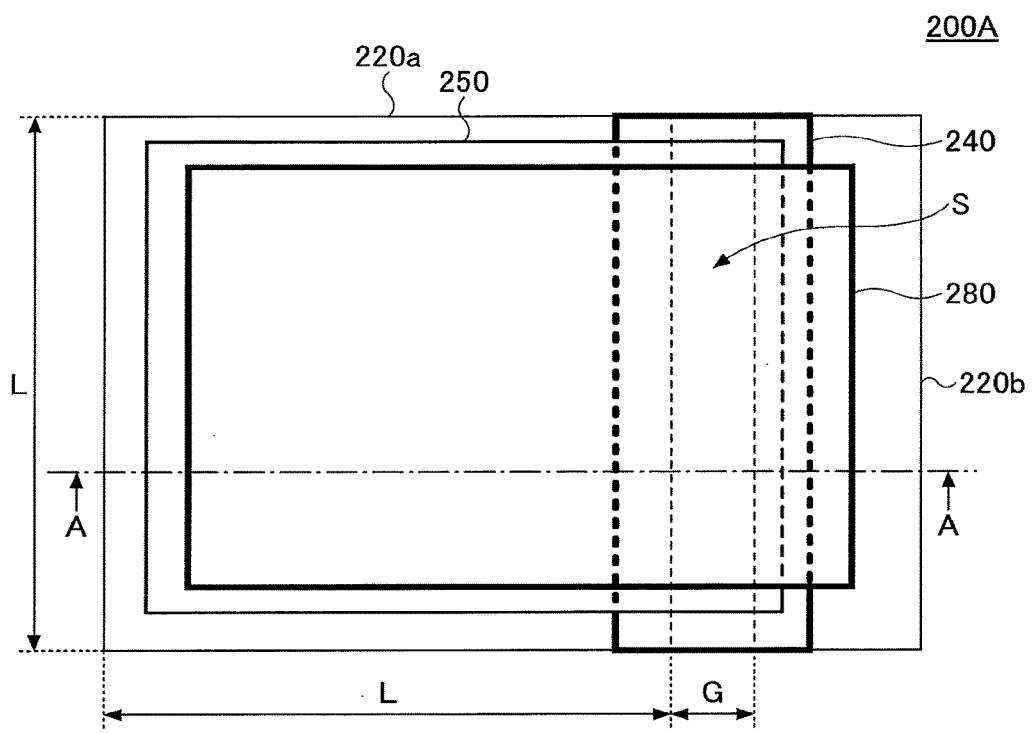
FIG. 8 is a top view schematically illustrating a light-emitting device for a lighting apparatus used in Example 1.

First, a light-emitting device 200A in which respective members have dimensional relations as illustrated in a topside view (FIG. 8) was assumed. Here, a cross-section cut along A-A in the light-emitting device 200A, illustrated in FIG. 8, schematically corresponds to the structure illustrated in FIG. 2. In FIG. 8, a substrate is omitted.

As illustrated in FIG. 8, in the light emitting device 200A, a light-emitting part has a shape of a square with a longitudinal length of L and a transverse length of L. The space S between the first bottom face electrode layer 220a and the second bottom face electrode layer 220b has a width G. Here, L was assumed to be 100 mm, and G was assumed to be 200 μm.

The characteristic regarding the bridge layer 240 was actually measured from an oxide film deposited on a glass substrate by the sputtering method. A sputtering target having a composition of 90 mol % ZnO-10 mol % $SiO_2$ was used. The deposition conditions were as follows:

Deposition pressure: 0.3 Pa,
Gas composition: Ar+10% $O_2$,
Distance between target and substrate: 6.5 cm, and
Deposition energy density: 9.9 W/cm².

Thickness t of the oxide film was assumed to be 300 nm (0.3 μm).

A specific resistance of the obtained oxide film measured using a four-terminal method was $\rho=9.8$ kΩcm.

Therefore, a resistance value $R_1$ of the bridge layer 240 can be obtained by the following formula:

Resistance value $R_1=\rho(k\Omega cm)\times G(\mu m)/(L(cm)\times t(\mu m))=653$ kΩ.

A resistance $r_1$ of the light-emitting device 200A can be obtained by the following formula:

Resistance of the light-emitting device 200A $r_1=15$ (V)/(3000(cd/m²)/30(cd/A)×0.01(m²))=15Ω, where the luminance was assumed to be 3000 cd/m², the light-emitting area was assumed to be $S=L^2=0.01$ m², the current efficiency was assumed to be 30 cd/A, and the electric voltage was assumed to be 15 V.

From result of the above-described calculation, the current value $I_1$ flowing in the bridge layer 240 was found to be sufficiently small compared with the current value $i_1$ flowing in the light-emitting device 200A (i.e. about 0.002%). Accordingly, it was confirmed that the characteristic of the light-emitting device was little affected by the bridge layer 240, and the light-emitting device 200A could be completely used as a light-emitting device for lighting apparatus.

Second Example

The light-emitting device according to the embodiment of the present invention was verified whether to be actually used as a light-emitting device for a passive-controlled display apparatus, for the configuration of the above-described fifth light-emitting device 500 illustrated in FIG. 5 as an example.

Figure 9:
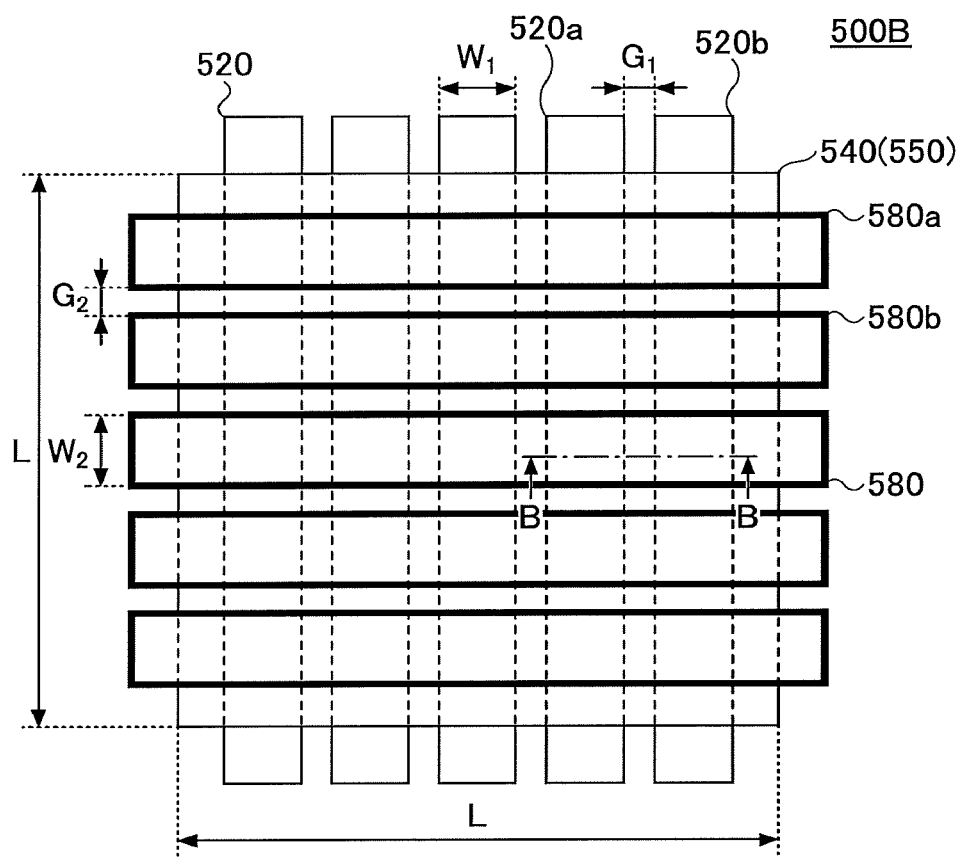
FIG. 9 is a top view schematically illustrating a light-emitting device for a display apparatus used in Example 2.

First, a light-emitting device 500B in which respective members have dimensional relations as illustrated in a topside view (FIG. 9) was assumed. Here, a cross-section cut along B-B in the light-emitting device 500B, illustrated in FIG. 9, schematically corresponds to the structure illustrated in FIG. 5. In FIG. 9, a substrate is omitted.

As illustrated in FIG. 9, in the light emitting device 500B, a first electrode 520 includes column electrodes and a second electrode 580 includes row electrodes. An intersection region of one of the column electrodes and one of the row electrodes is a light-emitting part. A width of respective bottom face electrode layers 520a, 520b included in the first electrode 520 is $W_1$, and a gap between the bottom face electrode layers 520a, 520b is $G_1$. Similarly, a width of respective upper electrode layers 580a, 580b included in the second electrode 580 is $W_2$, and a gap between the upper electrode layers 580a, 580b is $G_2$. An area S of one light-emitting part is a value of a product of $W_1$ and $W_2$. Here, both $W_1$ and $W_2$ were assumed to be 270 μm, and both $G_1$ and $G_2$ were assumed to be 30 μm.

Moreover, as illustrated in FIG. 9, a bridge layer 540 and an organic layer 550 were assumed to have the same shape in the top plan view, and assumed to be formed to have a shape of square with a side length of L. Here, L was assumed to be 20 mm.

The characteristic regarding the bridge layer 540 was actually measured from an oxide film deposited on a glass substrate by the sputtering method. A sputtering target having a composition of 85 mol % ZnO-15 mol % $SiO_2$ was used. The deposition conditions were as follows:

Deposition pressure: 0.25 Pa,
Gas composition: Ar,
Distance between target and substrate: 10 cm, and
Deposition energy density: 9.9 W/cm².

Thickness t of the oxide film was assumed to be 150 nm (0.15 μm).

A specific resistance of the obtained oxide film measured using a four-terminal method was $\rho=140$ kΩcm.

Therefore, a resistance value $R_2$ of the bridge layer 540 can be obtained by the following formula:

Resistance value $R_2=\rho(k\Omega cm)\times G(\mu m)/(L(cm)\times t(\mu m))=14$ MΩ.

In the light-emitting device 500B, when a number of scanning lines were assumed to be 50 (⅟₅₀ duty) and the luminance was assumed to be 300 cd/m², instantaneous luminance was 300 cd/m²×50=15000 cd/m². Moreover, the light-emitting area S is a value of a product of $W_1$ and $W_2$. Here, both $W_1$ and $W_2$ were assumed to be 270 μm, and the area S was assumed to be $7.29\times10^{-8}$ m².

Therefore, a resistance $r_2$ of the light-emitting device 500B can be obtained by the following formula:

Resistance of the light-emitting device 500B $r_2=10$ (V)/(15000(cd/m²)×7.29×10⁻⁸(m²)/10 (cd/A))=91.4 kΩ, where the current efficiency was assumed to be 10 cd/A, and the electric voltage was assumed to be 10 V.

From result of the above-described calculation, the current value $I_1$ flowing in the bridge layer 540 was found to be sufficiently small compared with the current value $i_1$ flowing in the light-emitting device 500B (i.e. about 6.5%). Accordingly, it was confirmed that the characteristic of the light-emitting device was little affected by the bridge layer 540, and the light-emitting device 500B could be completely used as a light-emitting device for passive-controlled display apparatus.

Third Example

The light-emitting device according to the embodiment of the present invention was verified whether to be actually used as a light-emitting device for an active-controlled display apparatus, for the configuration of the above-described sixth light-emitting device 600 illustrated in FIG. 6 as an example.

Figure 10:
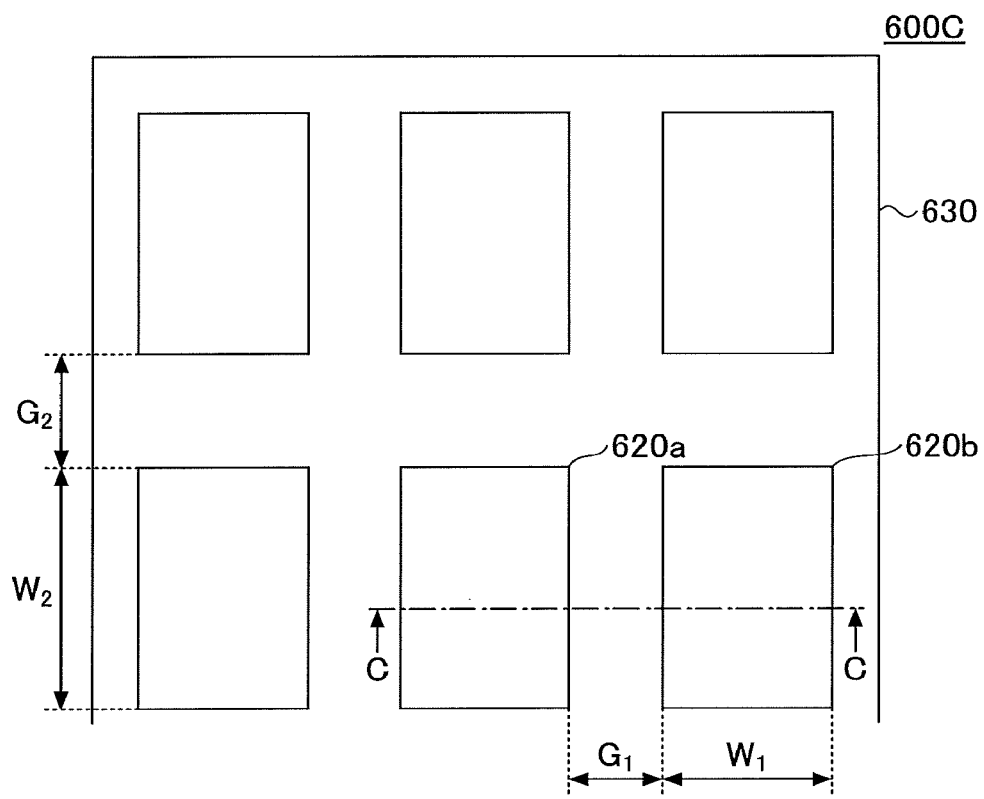
FIG. 10 is a top view schematically illustrating a light-emitting device for a display apparatus used in Example 3.

First, a light-emitting device 600C in which respective members have dimensional relations as illustrated in a topside view (FIG. 10) was assumed. Here, a cross-section cut along C-C in the light-emitting device 600C, illustrated in FIG. 10, schematically corresponds to the structure illustrated in FIG. 6. However, FIG. 10 illustrates only a TFT backplane 630 and a first electrode 620 (bottom face electrode layers 620a, 620b) for clarification.

In the top plan view, dimensions and a formation position of the bridge layer 640 were assumed to substantially coincide with dimensions and a formation position of the TFT backplane 630, respectively. Furthermore, in the top plan view, dimensions and formation positions of respective bottom face electrode layers 620a, 620b included in the first electrode 620 were assumed to coincide with dimensions and formation positions of corresponding organic light-emitting layers 653a, 653b, respectively.

As illustrated in FIG. 10, a first width (length in the horizontal direction) of the respective bottom face electrode layers 620a, 620b included in the first electrode 620 was assumed to be $W_1$, and a gap between both the bottom face electrode layers in the horizontal direction was assumed to be $G_1$. Moreover, a second width (length in the vertical direction) of the respective bottom face electrode layers 620a, 620b was assumed to be $W_2$, and a gap between both the bottom face electrode layers in the vertical direction was assumed to be $G_2$. Therefore, an area S of one light-emitting part is a value of a product of $W_1$ and $W_2$. Here, $W_1$ was assumed to be 70 μm, $W_2$ was assumed to be 260 μm, and $G_1$ was assumed to be 30 μm, and $G_2$ was assumed to be 40 μm.

The characteristic regarding the bridge layer 640 was actually measured from an oxide film deposited on a glass substrate by the sputtering method. A sputtering target having a composition of 90 mol % ZnO-10 mol % $SiO_2$ was used. The deposition conditions were as follows:

Deposition pressure: 0.25 Pa,
Gas composition: Ar,
Distance between target and substrate: 5 cm, and
Deposition energy density: 9.9 W/cm².

Thickness t of the oxide film was assumed to be 125 nm (0.125 μm).

A specific resistance of the obtained oxide film measured using a four-terminal method was ρ=21 kΩcm.

In this case, a resistance value $R_h$ of the bridge layer 640 in the horizontal direction is Resistance value $R_h$=ρ(kΩcm)×$G_1$(μm)/($W_2$(cm)×$t$(μm))=194 MΩ.

A resistance value $R_v$ of the bridge layer 640 in the vertical direction is

Resistance value $R_h$=ρ(kΩcm)×$G_2$(μM)/($W_1$(cm)×$t$(μm))=960 MΩ.

A resistance value $R_3$ of the bridge layer 640 around one pixel that is obtained as a parallel sum of the above resistance values can be obtained by the following formula:

Resistance value $R_3$=$R_h$×$R_v$/(($R_h$+$R_v$)×0.5)=80.6 MΩ.

In the light-emitting device 600C, the light-emitting area S is obtained by multiplying $W_1$ by $W_2$. Assuming $W_1$ and $W_2$ to be 260 μm and 70 μm, respectively, and the light-emitting area S is 1.82×10⁻⁸ cm². Moreover, the luminance of the light-emitting device 600C was assumed to be 2000 cd/m².

In this case, a resistance $r_3$ of the light-emitting device 600C can be obtained by the following formula:

Resistance of the light-emitting device 600C $r_3$=5 (V)/(2000(cd/m²)×1.82×10⁻⁸(m²)/10(cd/A))=1.73 MΩ, where the current efficiency was assumed to be 10 cd/A, and the electric voltage was assumed to be 5 V.

From result of the above-described calculation, the current value $I_1$ flowing in the bridge layer 640 was found to be sufficiently small compared with the current value $i_1$ flowing in the light-emitting device 600C (i.e. about 2.1%). Accordingly, it was confirmed that the characteristic of the light-emitting device was little affected by the bridge layer 640, and the light-emitting device 600C could be completely used as a light-emitting device for active-controlled display apparatus. Next, the example for the light-emitting device according to the present invention will be explained.

Example 1

According to the following method, samples in which oxide films were deposited on various substrates to be deposited were prepared. For the substrates to be deposited, a nickel substrate, a glass substrate, and the like were used.

(Deposition Condition)

As a deposition apparatus, an RF magnetron sputtering apparatus (manufactured by ULVAC, Inc.) was used. As a sputtering target, a sintered body having a diameter of 2 inches and including ZnO and $SiO_2$ with a predetermined ratio was used.

Upon deposition, first the substrate to be deposited was introduced into a chamber of the sputtering apparatus.

After reducing the pressure in the chamber of the sputtering apparatus to 10⁻⁵ Pa or less, a predetermined sputtering gas of 20 sccm was introduced into the chamber. As the sputtering gas, argon (Ar) gas of G1 grade (purity 99.99995 vol. %) or a mixed gas of argon (Ar) gas of G1 grade and oxygen ($O_2$) gas of G1 grade (purity 99.99995 vol. %) was used. That is, as the sputtering gas, an Ar gas or an $O_2$/Ar mixed gas with oxygen concentration of 20% was used.

A pressure of the sputtering gas was set to a predetermined pressure. An interval between the target and the substrate to be deposited (T-S distance) was set to a predetermined interval. An electric power of 50 W was applied to a cathode of the sputtering apparatus. A temperature of the substrate upon deposition was 70° C. or less.

Examples 2 to 9

Using the same method as in Example 1, samples in which oxide films were deposited on various substrates to be deposited were prepared. However, in Examples 2 to 9, deposition conditions different from that in Example 1 were employed.

The deposition conditions used in Examples 1 to 9 are illustrated collectively in TABLE 1 as follows:

TABLE 1

| Example | Composition of target (mol %) ZnO/$SiO_2$ | Gas pressure (Pa) | Oxygen concentration (%) | T-S distance (cm) |
|---|---|---|---|---|
| 1 | 85/15 | 0.3 | 20 | 5 |
| 2 | 90/10 | 0.3 | 0 | 11 |
| 3 | 90/10 | 1.0 | 0 | 11 |
| 4 | 90/10 | 0.3 | 0 | 6.5 |
| 5 | 90/10 | 1.0 | 0 | 6.5 |
| 6 | 90/10 | 0.3 | 20 | 6.5 |
| 7 | 95/5 | 0.3 | 0 | 5 |
| 8 | 97/3 | 0.3 | 0 | 6.5 |
| 9 | 97/3 | 0.3 | 20 | 6.5 |

Using the respective samples obtained in Examples 1 to 9, the following evaluations were performed.

(Evaluation 1: Ratio of Numbers of Atoms)

Using the respective samples obtained in Examples 1 to 9, a ratio of numbers of atoms (Zn/(Zn+Si)) of oxide films was evaluated. In the respective samples, the substrates to be submitted were nickel substrates.

The ratio of numbers of atoms was obtained by performing an SEM-EDX analysis for the oxide films. In order to reduce the influence from the nickel substrate, an acceleration voltage was 10 kV.

The obtained results are shown collectively in the field of "Zn/(Zn+Si)" in TABLE 2 as follows:

TABLE 2

| Example | Zn/(Zn + Si) | Scherrer diameter (nm) | State | Band gap (eV) | Electron affinity (eV) | Resistivity (Ωcm) |
|---|---|---|---|---|---|---|
| 1 | 0.76 | 1.2 | amorphous | 4.0 | 2.6 | — |
| 2 | 0.88 | 1.1 | amorphous | 3.3 | 3.3 | 1.8 |
| 3 | 0.91 | 2.3 | amorphous | 3.3 | 3.3 | $5.2 \times 10^{-2}$ |
| 4 | 0.86 | 1.4 | amorphous | 3.3 | 3.3 | 4.1 |
| 5 | 0.89 | 1.3 | amorphous | 3.3 | 3.3 | $1.3 \times 10^{-1}$ |
| 6 | 0.88 | 2.2 | amorphous | 3.3 | 3.3 | $9.8 \times 10^{-3}$ |
| 7 | 0.94 | 4.2 | amorphous | 3.2 | 3.4 | 75 |
| 8 | 0.96 | 7.0 | crystalline | — | — | — |
| 9 | 0.96 | 8.4 | crystalline | — | — | — |

(Evaluation 2: X-Ray Diffraction)

Using the respective samples obtained in Examples 1 to 9, X-ray diffraction patterns of the oxide films were measured. In the respective samples, the substrates to be deposited were quartz glass substrates with a thickness of 1 mm.

An X-ray diffraction spectrum was measured by a Seemann Bohlin technique using an X-ray diffraction apparatus RINT-2000 (manufactured by Rigaku Corporation). The Seemann Bohlin technique is described in Bulletin of the Japan Institute of Metals Vol. 27(1988) No. 6, pages 461 to 465. The diffraction pattern was obtained by irradiating the electron beam on Cu under a condition of acceleration voltage 50 kV and discharging current 300 mA, and irradiating the generated CuKα rays on the sample while fixing the incident angle to be 0.5°.

Figure 11:
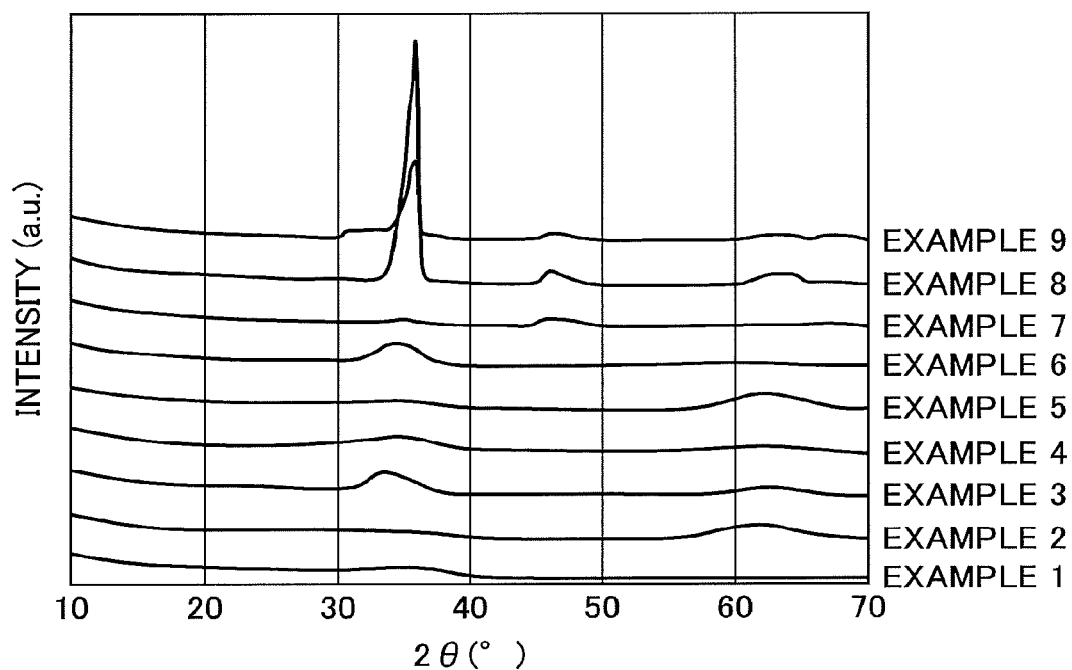
FIG. 11 is a diagram illustrating X-ray diffraction spectra of samples in Examples 1 to 9.

FIG. 11 illustrates diffraction patterns obtained for the respective samples.

In the diffraction patterns, a halo pattern derived from wurtzite-type ZnO was observed. A Scherrer diameter on a (002) plane of wurtzite-type ZnO around a diffraction angle 2θ of 33° is shown in the field of "Scherrer diameter" in TABLE 2.

For the films obtained in Examples 1 to 7, the Scherrer diameter was 5 nm or less, a sharp peak was not observed in the X-ray diffraction, and it was confirmed that the film was amorphous or a state of amorphous state was dominant. In Examples 8 and 9, the Scherrer diameters were greater than 5 nm, and it was confirmed that crystalline substances were dominant in the X-ray diffraction.

(Evaluation 3: UPS Measurement)

Using the respective samples obtained in Examples 1 to 9, ionization potential was measured using an ultraviolet photoelectron spectroscopy (UPS) method.

In the respective samples, the substrates to be deposited were substrates obtained by depositing ITO of 150 nm on alkali-free glass substrates (in the following, referred to as ITO substrates). An oxide film with thickness of 10 nm was deposited on a surface where ITO of the ITO substrate was deposited.

The ultraviolet photoelectron spectroscopy was performed by irradiating the film with ultraviolet rays of a He lamp (He(I), 21.22 eV) in a high vacuum of $10^{-7}$ Pa or higher.

Figure 12:
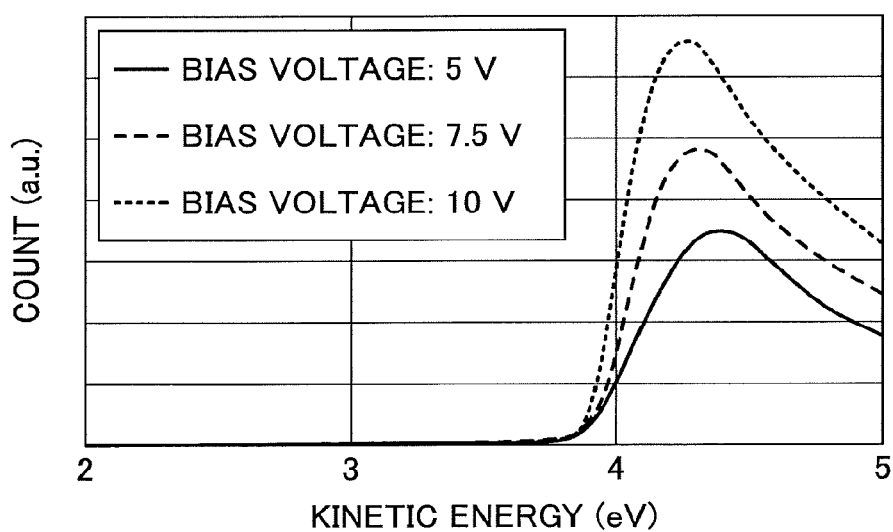
FIG. 12 is a diagram illustrating UPS spectra (work functions) in the sample in Example 1.
Figure 13:
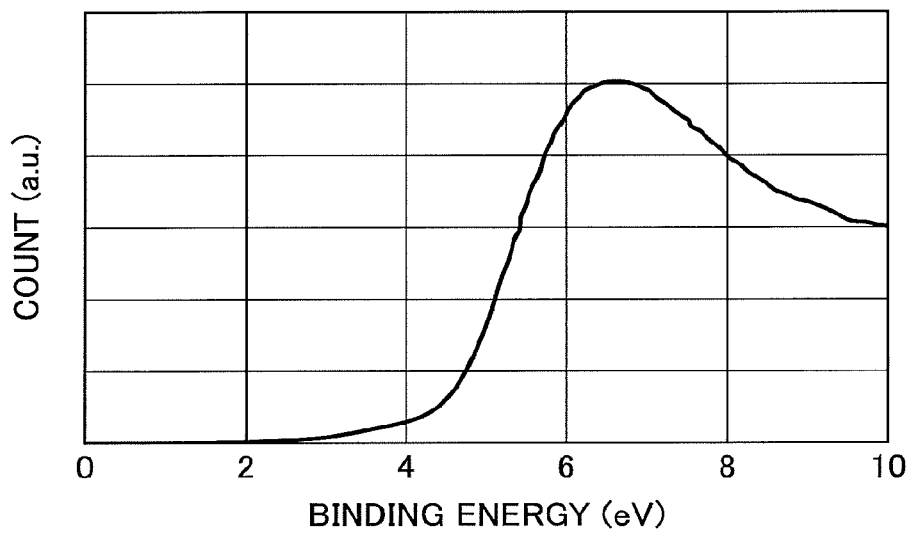
FIG. 13 is a diagram illustrating UPS spectra (ionization potential) in the sample in Example 1.

Results of measurement obtained for the sample of Example 1 are shown in FIGS. 12 and 13. FIG. 12 illustrates a relation between numbers of counts of photoelectrons and kinetic energies of photoelectrons. FIG. 13 illustrates a relation between numbers of counts of photoelectrons and binding energies.

From FIG. 12, a work function of thin films in the sample of Example 1 was estimated to be 3.9 eV. Moreover, from FIG. 13, an ionization potential of the oxide film in the sample of Example 1, which is a sum of the binding energy and the work function, was estimated to be 6.6 eV.

(Evaluation 4: Optical Absorption Coefficient)

Using the respective samples obtained in Examples 1 to 9, optical absorption coefficients of the respective oxide films were estimated. In the respective samples, the substrates to be deposited were quartz glass substrates with a thickness of 1 mm.

The optical absorption coefficients were estimated by measuring reflection rates and transmission rates using the respective samples. Moreover, from a Tauc plot for the obtained optical absorption coefficients, an optical band gap was obtained.

Figure 14:
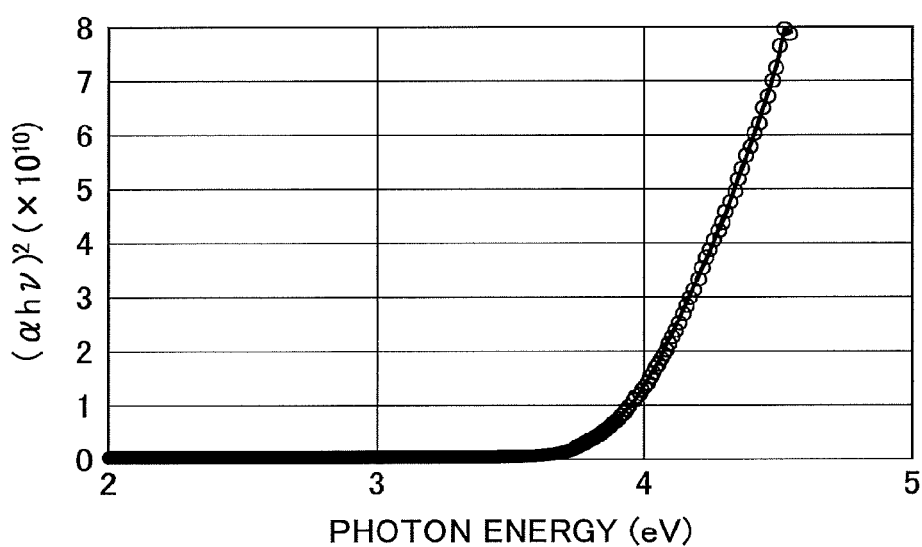
FIG. 14 is a diagram illustrating a Tauc plot of a film of an inorganic material in the sample in Example 1.
Figure 15:
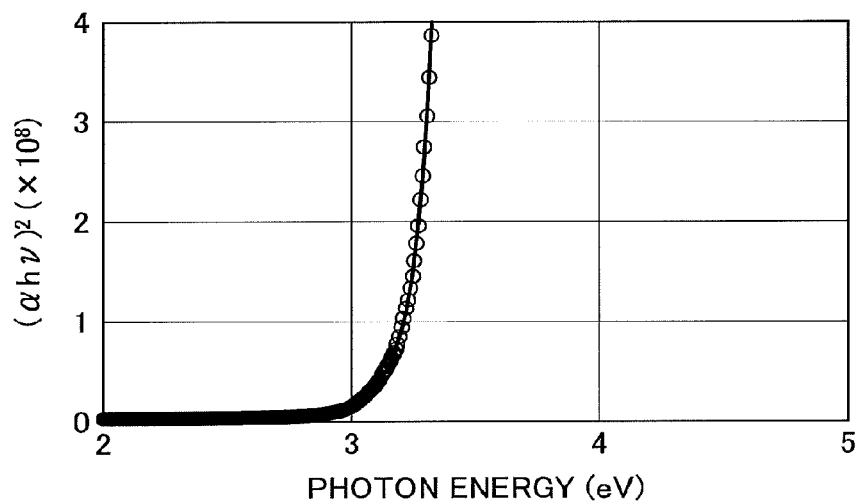
FIG. 15 is a diagram illustrating a Tauc plot of a film of an inorganic material in the sample in Example 2.

FIGS. 14 and 15 illustrate Tauc plots for oxide films in Examples 1 and 2, respectively.

In the field of "band gap" in TABLE 2, the optical band gaps obtained for the respective samples are collectively shown. For the samples of Examples 1 to 7, the optical band gaps fall within a range of 3.2 to 4.0.

By checking against the results for the ionization potential obtained by the above-described UPS measurement, an electron affinity of the oxide film in the sample of Example 1 is expected to be 2.6 eV. Also in the oxide films of Examples 2 to 7, assuming the ionization potential of the same degree, electron affinities are expected to be about 3.3 to 3.4 eV.

(Evaluation 5: Resistivity)

Using the respective samples obtained in Examples 2 to 7, resistivity of the respective oxide film was measured. In the respective samples, the substrates to be deposited were quartz glass substrates with a thickness of 1 mm.

The resistivity was measured using a four-terminal method. In the respective samples, aluminum layers including Nd with a width of 1 mm were deposited by sputtering at 2 mm intervals. These layers were used as electrodes for measurement.

As a target of the deposition by sputtering, an aluminum target including 2 mol % Nd with a diameter of 2 inches manufactured by Kobelco Research Institute, Inc. (product name: AD20) was used.

Results of measurement are shown collectively in the field of "resistivity" in TABLE 2.

(Evaluation 6: Evaluation for Electron Transportability)

By a method described as follows, a device in which only electrons flow, so-called electron only device was prepared, and a characteristic thereof was evaluated.

In the electron only device, a cathode is arranged on a glass substrate as a bottom electrode, an electron transportation layer with a thickness of 150 nm is arranged on the bottom electrode, and an anode is arranged on the electron transportation layer as a top electrode so as to be orthogonal to the bottom electrode.

The cathode was formed, using an aluminum target including 2 mol % Nd with a diameter of 2 inches manufactured by Kobelco Research Institute, Inc. (product name: AD20), by performing deposition by sputtering so that the aluminum including Nd has a thickness of 80 nm and a width of 1 mm. As the electron transportation layer, an Alq3 layer with a thickness of 150 nm was formed. The anode is formed by performing vacuum deposition so as to have an aluminum layer with a thickness of 80 nm.

An electric voltage was applied to the cathode and the anode of the electron only device, and a generated electric current was measured.

Figure 16:
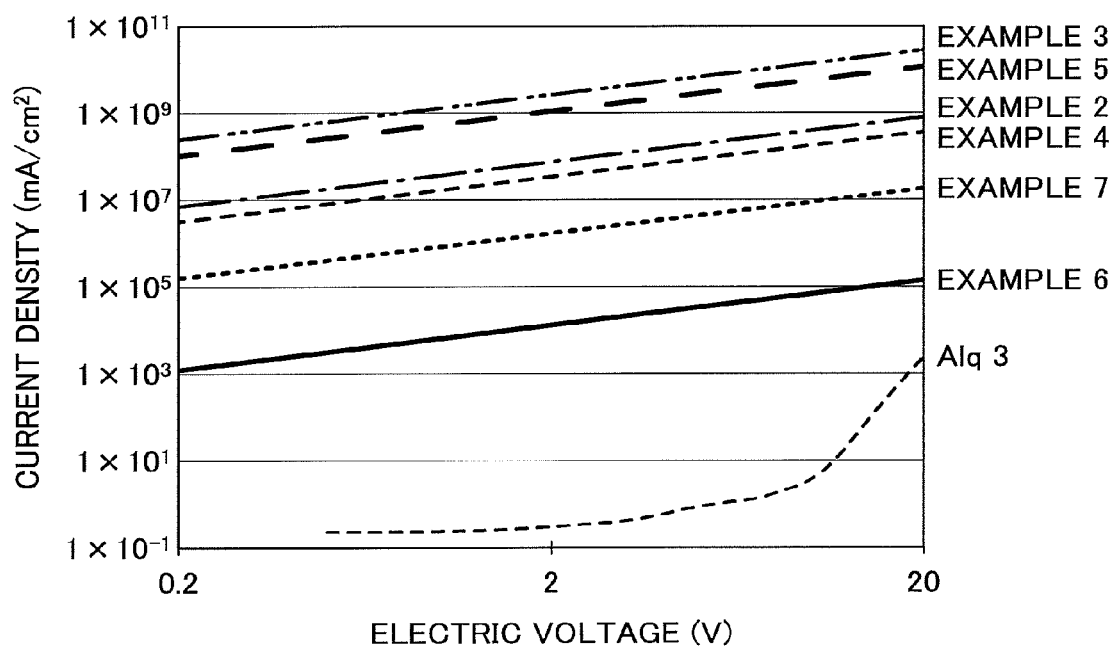
FIG. 16 is a diagram illustrating current-voltage characteristics in an electron only device and in the samples in Examples 2 to 7 as a whole.

FIG. 16 illustrates current-voltage characteristic (denoted as "Alq3") obtained for the electron only device.

In FIG. 16, current-voltage characteristics for the samples of Examples 2 to 7 are also illustrated. These current-voltage characteristics were estimated from the above-described resistivity for the respective samples.

For the estimation, the following formula (1) was used:

$$I/A = E/(\rho \cdot L),\qquad \text{Formula (1)}$$

where I is a current density, A is an area, E is an electric voltage, $\rho$ is a resistivity, and L is a thickness of the electron transportation layer. The thickness of the electron transportation layer was 150 nm.

From FIG. 16, within a range of the applied voltage up to 20 V, electric current values for the samples of Examples 2 to 7 are found to be more than several orders of magnitude greater than the electron only device in which Alq3 is used for the electron transportation layer. In FIG. 16, a voltage region greater than 20 V is not shown, because application of such high electric voltage may cause degradation of a device and is impracticable.

From FIG. 16, the oxide films in the samples of Examples 2 to 7, when used as the electron transportation layers, are found to have sufficient electron transportability as organic EL devices, even if the thickness is 150 nm.

When the above-described oxide films are subjected to the patterning processing so as to have a desired resistance value, and applied to the bridge layer, the effect of preventing damage by electrostatic discharge can be obtained.

Example 10

Next, an example of application of the above-described oxide layer to the electron transport layer of the organic EL device, in addition to the bridge layer will be described.

By a method described as follows, an organic EL device was prepared, and characteristic thereof was evaluated. In the organic EL device, a cathode was arranged on a glass substrate as a bottom electrode, and an electron transport layer, a light-emitting layer, a hole transport layer, a hole injection layer, and an anode as a top electrode were arranged in this order on the bottom electrode. The organic EL device had a structure of extracting light from the anode side. Moreover, in Example 11, forming an electron injection layer, a hole block layer and an electron block layer was omitted.

First, on the glass substrate, the cathode was formed. As the glass substrate, an alkali-free glass substrate was used. A cleaned glass substrate and a metallic mask were arranged in a chamber of a sputtering apparatus. Moreover, a target for deposition of cathode was arranged in the chamber of the sputtering apparatus. As the target for cathode, an aluminum target including 2 mol % Nd with a diameter of 2 inches manufactured by Kobelco Research Institute, Inc. (product name: AD20) was used. Using the metallic mask, the cathode 120 was deposited by sputtering to have a thickness of 80 nm and a width of 1 mm on the glass substrate. The sputtering gas was Ar gas, and a pressure of the sputtering gas was 0.3 Pa, and an electric power of 50 W was applied to the spatter cathode.

Next, an electron transport layer was formed on the cathode. The metallic mask was not removed, but with the sputtering condition of Example 7, an oxide film with a thickness of 100 nm was deposited as an electron transport layer on the glass substrate on which the cathode was formed.

Next, a light-emitting layer, a hole transport layer, and a hole injection layer were formed on the electron transport layer. The glass substrate on which the electron transport layer (and the cathode) was formed was conveyed from the chamber of the sputtering apparatus to a chamber for vacuum deposition under an atmosphere of a high vacuum of $10^{-4}$ Pa or higher. Subsequently, an Alq3 with a thickness of 50 nm was deposited on the electron transport layer as the light-emitting layer. Then, an $\alpha$-NPD with a thickness of 50 nm was deposited on the light-emitting layer as the hole transport layer. Subsequently, an $MoO_x$ with a thickness of 0.8 nm was deposited on the hole transport layer as the hole injection layer.

Next, an anode was formed on the hole injection layer. Gold (Au) with a thickness of 10 nm and a width of 1 mm was deposited as the anode on the glass substrate on which the hole injection layer was formed. The degree of vacuum upon deposition was about $8 \times 10^{-6}$ Pa. Because visible light passes through the anode, the device has a structure of extracting light from the anode (top electrode) side.

The light-emitting layer, the hole transport layer, and the hole injection layer were formed by using the metallic mask so as to completely cover the cathode and the electron transport layer. The anode was formed by using the metallic mask so as to be orthogonal to the cathode. An overlapping region of 1 mm×1 mm of the anode having the width of 1 mm with the cathode having the width of 1 mm, the anode being deposited so as to be orthogonal to the cathode, was a region that emits light by applying the electric voltage.

According to the above-described processes, the organic EL device provided with the glass substrate, the cathode including aluminum containing 2 mol % neodymium, the electron transport layer including the oxide film, the light-emitting layer including Alq3, the hole transport layer including $\alpha$-NPD, the hole injection layer including $MoO_x$, and the anode including gold, was prepared.

(Evaluation of Characteristics of Organic EL Device)

Next, a direct-current voltage was applied to the organic EL device, and an electric current and luminance were measured. The measurement was performed by measuring luminance and an electric current value obtained when an electric voltage of a predetermined value was applied between the cathode and the anode of the organic EL device in a glove box purged with nitrogen. For the measurement of luminance, a luminance meter (BM-7A) manufactured by TOPCON Corporation was used.

Figure 17:
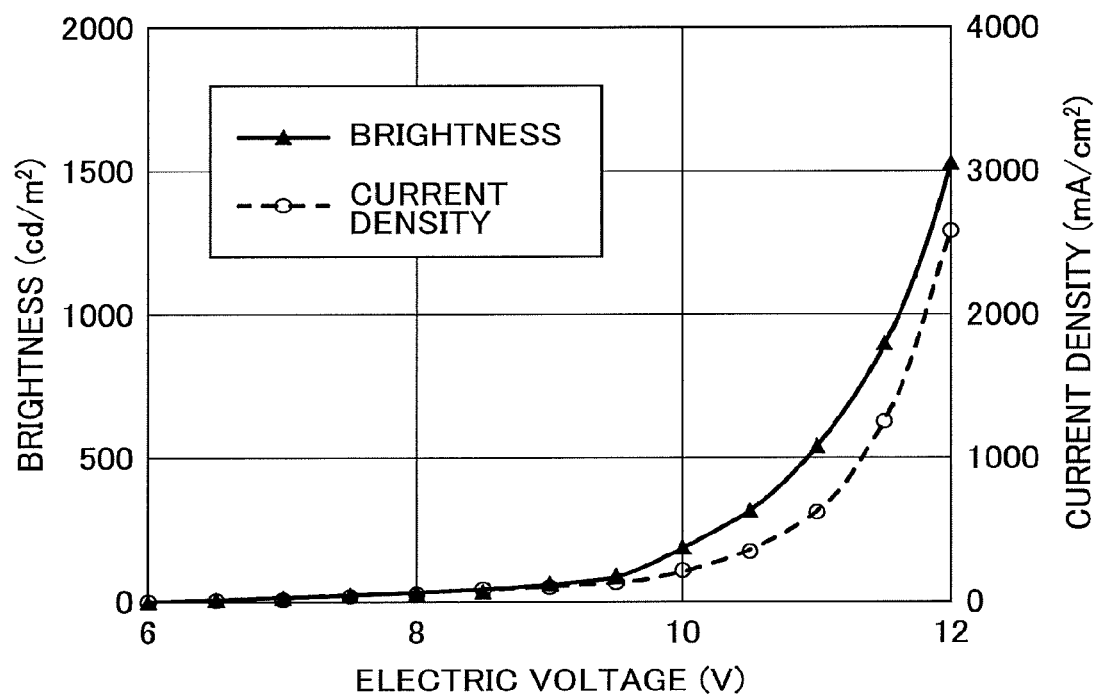
FIG. 17 is a diagram illustrating a current-voltage-luminance characteristic measured in the organic EL device in FIG. 10.

FIG. 17 illustrates current-voltage-luminance characteristic obtained as above. The organic EL device increased the luminance and the current density from 8 V. At 12 V, the luminance was 1500 cd/m$^2$ and the current density was 2.6 A/cm$^2$. From the above-described result, the oxide film with a thickness of 100 nm was confirmed to function as the electron transport layer.

In this way, it was confirmed that the oxide layer could be used as a bridge layer and an electron transport layer. In this case, without increasing a deposition process the bridge layer and the electron transport layer can be formed simultaneously.

Among the light-emitting devices, there is a light-emitting device, which uses a material that is easily affected by oxygen and water in an environment, and thereby performance of the light-emitting device may be degraded. Moreover, for such a light-emitting device, in order to prevent the degradation of the performance, the light-emitting device is manufactured or used under an environment in which oxygen and water are controlled.

However, under such an environment, the light-emitting device easily becomes charged due to static electricity. When the static electricity is discharged, configuration elements may be damaged by electrostatic discharge. Therefore, in the field of light-emitting devices, countermeasure against static electricity is one of the important subjects.

Here, as described above, Japanese Unexamined Patent Application Publication No. 2004-047179 discloses forming an antistatic film on the back surface of the substrate of the device or the like, for the countermeasure against static electricity of the organic electroluminescent device.

However, charging and discharging of static electricity do not always occur on the back surface of the substrate. Especially, while manufacturing the light-emitting device, damage by electrostatic discharge may occur in an upper part of the substrate, i.e. from the configuration element side. In the countermeasure against static electricity as disclosed in Japanese Unexamined Patent Application Publication No. 2004-047179, such damage by electrostatic discharge at a site other than the back surface of the substrate is difficult to be prevented completely.

Moreover, when an antistatic film is formed on the back surface of the substrate, upon handling and conveying the light-emitting device, the antistatic film may be grazed and may be exfoliated from the substrate. When the antistatic film is exfoliated, the antistatic effect cannot be obtained any more. Moreover, when such an exfoliation occurs in the process of manufacturing, an exfoliated substance may be a cause for contamination.

In this way, regarding the damage by electrostatic discharge of a light-emitting device, an adequate countermeasure has not been established yet, and an effective countermeasure is still required.

According to the present invention, a light-emitting device that significantly prevents damage by electrostatic discharge in a manufacturing process and a use situation can be provided. Moreover, according to the present invention, a display apparatus and lighting apparatus that include such light-emitting devices can be provided.

The present invention can be used for a light-emitting apparatus, a display apparatus and the like.

What is claimed is:

1. A light-emitting device comprising:
a pair of first electrodes arranged separated from and opposing each other on a first surface of a substrate;
a light-emitting layer arranged on at least one of the first electrodes;
a second electrode arranged on the light-emitting layer; and
a bridge layer connecting the first electrodes,
wherein the bridge layer is formed of a material having a resistance that falls within a range of 100 kΩ to 100 MΩ.

2. The light-emitting device according to claim 1,
wherein the bridge layer is formed of a material selected from a group including a zinc-tin-silicon-oxygen-based material, a zinc-tin-oxygen-based material, and a zinc-silicon-oxygen-based material.

3. The light-emitting device according to claim 2,
wherein the zinc-silicon-oxygen-based material includes zinc (Zn), silicon (Si), and oxygen (O), and a ratio of numbers of atoms of Zn/(Zn+Si) is from 0.3 to 0.95.

4. The light-emitting device according to claim 2,
wherein the zinc-tin-silicon-oxygen-based material includes zinc (Zn), tin (Sn), silicon (Si), and oxygen (O), and
wherein in terms of oxide based on 100 mol % of total of oxides of the bridge layer, $SnO_2$ is greater than 15 mol % but less than or equal to 95 mol %.

5. The light-emitting device according to claim 4,
wherein in terms of oxide based on 100 mol % of total of oxides of the bridge layer, $SiO_2$ is greater than or equal to 7 mol % but less than or equal to 30 mol %.

6. The light-emitting device according to claim 2,
wherein the zinc-tin-oxygen-based material includes zinc (Zn), tin (Sn), and oxygen (O), and
wherein in terms of oxide based on 100 mol % of total of oxides of the bridge layer, $SnO_2$ is greater than 15 mol % but less than or equal to 95 mol %.

7. The light-emitting device according to claim 1,
wherein the bridge layer includes an amorphous oxide.

8. The light-emitting device according to claim 1,
wherein the light-emitting layer includes an organic light-emitting layer.

9. The light-emitting device according to claim 1,
wherein the bridge layer is arranged so as to be in contact with the first surface of the substrate.

10. The light-emitting device according to claim 1,
wherein the bridge layer is configured to function as an electron injection layer.

11. The light-emitting device according to claim 1,
wherein at least one of the first electrodes includes a material selected from a group including ITO, $SnO_2$, and IZO.

12. The light-emitting device according to claim 1,
wherein both the first electrodes have the same polarity.

13. A display apparatus comprising the light-emitting device according to claim 12.

14. The light-emitting device according to claim 1,
wherein the first electrodes have opposite polarities to each other.

15. A lighting apparatus comprising the light-emitting device according to claim 14.

* * * * *